United States Patent
Imai

(10) Patent No.: US 12,385,993 B2
(45) Date of Patent: Aug. 12, 2025

(54) MAGNETIC RESONANCE IMAGING APPARATUS AND RF COIL

(71) Applicant: CANON MEDICAL SYSTEMS CORPORATION, Otawara (JP)

(72) Inventor: Satoshi Imai, Nasushiobara (JP)

(73) Assignee: CANON MEDICAL SYSTEMS CORPORATION, Otawara (JP)

(*) Notice: Subject to any disclaimer, the term of this patent is extended or adjusted under 35 U.S.C. 154(b) by 203 days.

(21) Appl. No.: 18/364,718

(22) Filed: Aug. 3, 2023

(65) Prior Publication Data
US 2024/0045008 A1    Feb. 8, 2024

(30) Foreign Application Priority Data
Aug. 4, 2022    (JP) ................. 2022-124731

(51) Int. Cl.
G01R 33/36    (2006.01)

(52) U.S. Cl.
CPC ..... G01R 33/3614 (2013.01); G01R 33/3664 (2013.01)

(58) Field of Classification Search
CPC ............ G01R 33/3614; G01R 33/3664; G01R 33/3621; G01R 33/3415
See application file for complete search history.

(56) References Cited

U.S. PATENT DOCUMENTS
2013/0119991 A1    5/2013    Soutome et al.

FOREIGN PATENT DOCUMENTS
JP    2014-4476 A    1/2014
WO    WO-2014024114 A1 *    2/2014    ......... G01R 33/3415

* cited by examiner

Primary Examiner — G. M. A Hyder
(74) Attorney, Agent, or Firm — Oblon, McClelland, Maier & Neustadt, L.L.P.

(57) ABSTRACT

A magnetic resonance imaging apparatus of an embodiment includes an RF coil including a plurality of coil elements, a plurality of preamplifiers, a combiner, and a transmission line. The coil elements transmit an RF pulse to a subject placed in an imaging space, and receive a signal generated from the subject by the RF pulse. The preamplifiers are each connected to each of the coil elements via an input channel with the number of channels corresponding to the coil element, and amplify the signal received by the coil element. The combiner is connected to each pair of preamplifiers that are paired among the preamplifiers, and generates a combined signal obtained by combining the signals amplified by the preamplifiers. The transmission line transmits the combined signal combined by the combiner.

8 Claims, 11 Drawing Sheets

FIG.8

| COIL TYPE | COIL ORIENTATION | PAIR | |
|---|---|---|---|
| | | FIRST | SECOND |
| A COIL | X DIRECTION | FIRST SECTION | SIXTH SECTION |
| | | SECOND SECTION | FIFTH SECTION |
| | Y DIRECTION | FIRST SECTION | FIFTH SECTION |
| | | SECOND SECTION | FOURTH SECTION |
| | Z DIRECTION | SECOND SECTION | SIXTH SECTION |
| | | THIRD SECTION | FIFTH SECTION |
| ⋮ | ⋮ | ⋮ | ⋮ |

MAGNETIC RESONANCE IMAGING APPARATUS AND RF COIL

CROSS-REFERENCE TO RELATED APPLICATIONS

This application is based upon and claims the benefit of priority from Japanese Patent Application No. 2022-124731, filed on Aug. 4, 2022, the entire contents of which are incorporated herein by reference.

FIELD

Embodiments described herein relate generally to a magnetic resonance imaging apparatus and an RF coil.

BACKGROUND

Conventionally, in a magnetic resonance imaging (MRI) apparatus, an RF coil is used for imaging a subject. The RF coil is placed in the vicinity of the subject during imaging, transmits an RF pulse to the subject placed in the imaging space, and receives an NMR signal generated from the subject under the influence of the RF pulse. As the RF coil, a phased array coil formed by combining a plurality of surface coils as coil elements is known.

BRIEF DESCRIPTION OF THE DRAWINGS

FIG. 8 is a diagram illustrating an example of a specification table according to the modification;

DETAILED DESCRIPTION

A magnetic resonance imaging apparatus of an embodiment includes an RF coil including a plurality of coil elements, a plurality of preamplifiers, a combinercombiner, and a transmission line; reception circuitry including a conversion unit; and processing circuitry. The coil elements transmit an RF pulse to a subject placed in an imaging space, and receive a signal generated from the subject by the RF pulse. The preamplifiers are each connected to each of the coil elements via an input channel with the number of channels corresponding to the coil element, and amplify the signal received by the coil element. The combiner is connected to each pair of preamplifiers that are paired among the preamplifiers, and generates a combined signal obtained by combining the signals amplified by the preamplifiers. The transmission line transmits the combined signal combined by the combiner. The conversion unit converts the combined signal transmitted by the transmission line into digital data. The processing circuitry performs control of switching ON/OFF of the power supply of each of the preamplifiers, according to the imaging conditions for capturing an image of the subject.

Hereinafter, an embodiment of an MRI apparatus and an RF coil according to the present specification will be described in detail with reference to the accompanying drawings.

Figure 1:
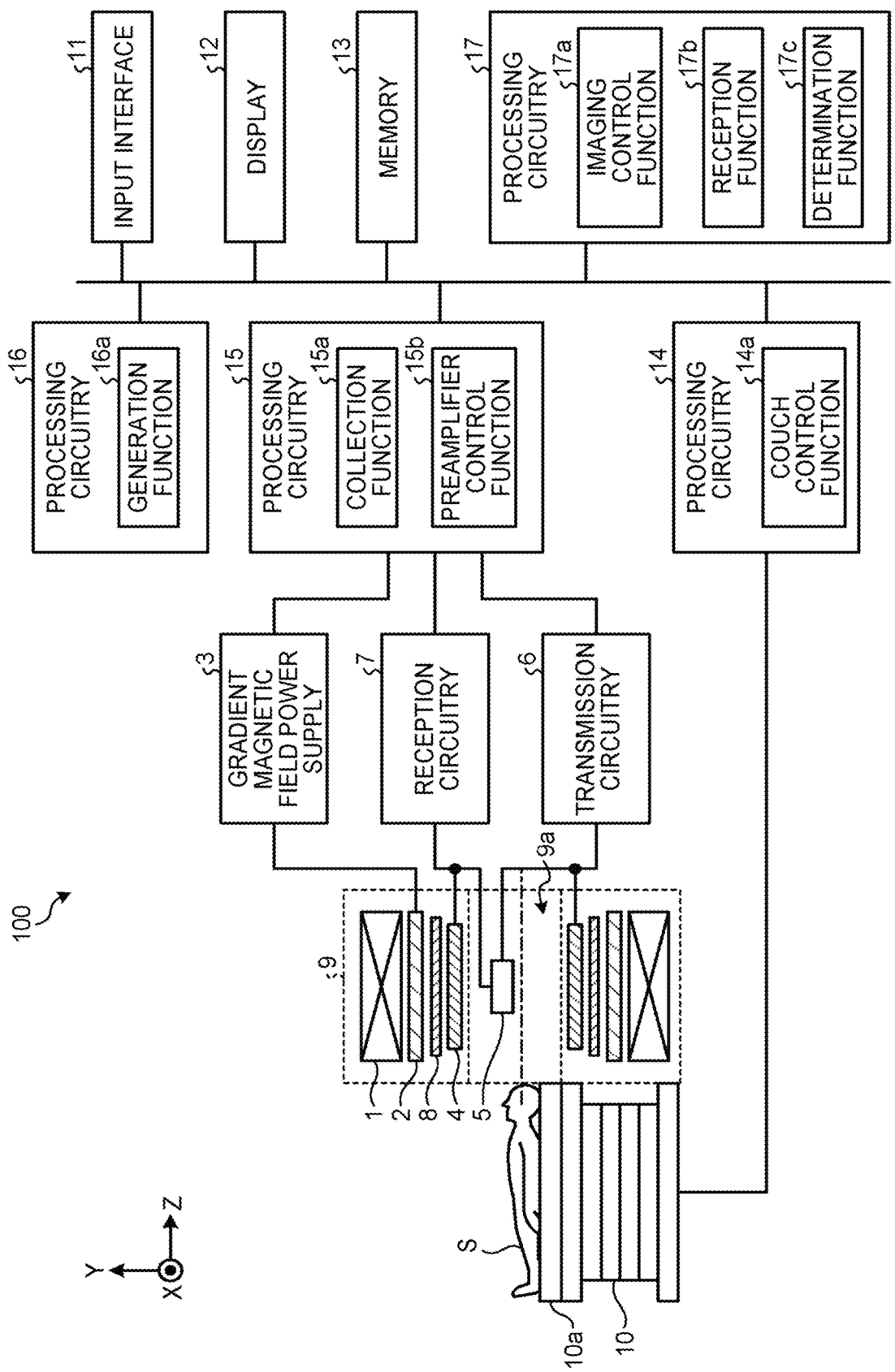
FIG. 1 is a block diagram illustrating an example of a configuration of an MRI apparatus according to an embodiment; Is a diagram illustrating.

FIG. 1 is a block diagram illustrating an example of a configuration of an MRI apparatus according to an embodiment.

For example, as illustrated in FIG. 1, an MRI apparatus 100 includes a static magnetic field magnet 1, a gradient coil 2, a gradient magnetic field power supply 3, a whole body RF coil 4, a local RF coil 5, transmission circuitry 6, reception circuitry 7, an RF shield 8, a frame 9, a couch 10, an input interface 11, a display 12, a memory 13, and processing circuitry 14 to 17.

The static magnetic field magnet 1 generates a static magnetic field in the imaging space in which a subject S is placed. Specifically, the static magnetic field magnet 1 is formed in a substantially hollow cylindrical shape (including one in which the shape of a cross-section orthogonal to the center axis is an oval shape). The static magnetic field magnet 1 generates a static magnetic field in the imaging space formed on the inner peripheral side of the static magnetic field magnet 1. For example, the static magnetic field magnet 1 is a superconducting magnet, a permanent magnet, or the like. For example, the superconducting magnet referred to in this example includes a container filled with coolant such as liquid helium, and a superconducting coil immersed in the container.

The gradient coil 2 is arranged inside the static magnetic field magnet 1, and generates a gradient magnetic field in the imaging space in which the subject S is placed. Specifically, the gradient coil 2 is formed in a substantially hollow cylindrical shape (including one in which the shape of a cross-section orthogonal to the center axis is an oval shape). The gradient coil 2 includes an X coil, a Y coil, and a Z coil each corresponding to each of the X axis, Y axis, and Z axis orthogonal to each other.

The X coil, Y coil, and Z coil generate a gradient magnetic field that varies linearly along each axis direction in the imaging space, on the basis of the electric current supplied from the gradient magnetic field power supply 3. In this example, the Z axis is set along the magnetic flux of the static magnetic field generated by the static magnetic field magnet 1. Moreover, the X axis is set along the horizontal direction orthogonal to the Z axis, and the Y axis is set along the vertical direction orthogonal to the Z axis. In this example, the X axis, Y axis, and Z axis form an apparatus coordinate system unique to the MRI apparatus 100.

The gradient magnetic field power supply 3 generates a gradient magnetic field in the imaging space, by supplying electric current to the gradient coil 2. Specifically, by supplying electric current individually to the X coil, Y coil, and Z coil of the gradient coil 2, the gradient magnetic field power supply 3 generates a gradient magnetic field that varies linearly along each of the readout direction, the phase encode direction, and the slice direction that are orthogonal to each other, in the imaging space.

In this example, the axis along the readout direction, the axis along the phase encode direction, and the axis along the slice direction form a logical coordinate system that defines a slice area or a volume area serving as an object to be imaged.

Specifically, the gradient magnetic field along each of the readout direction, the phase encode direction, and the slice direction is superimposed on the static magnetic field generated by the static magnetic field magnet 1, and provides spatial position information to the NMR signal generated from the subject S. Specifically, the gradient magnetic field in the readout direction provides the position information in the readout direction to the NMR signal, by changing the frequency of the NMR signal according to the position in the readout direction.

Moreover, the gradient magnetic field in the phase encode direction provides the position information in the phase encode direction to the NMR signal, by changing the phase of the NMR signal according to the position in the phase encode direction. Furthermore, the gradient magnetic field in the slice direction provides the position information in the slice direction to the NMR signal.

For example, when the imaging area is the slice area (2D imaging), the gradient magnetic field in the slice direction is used to determine the direction, thickness, and number of the slice area. When the imaging area is the volume area (3D imaging), the gradient magnetic field in the slice direction is used to change the phase of the NMR signal according to the position in the slice direction.

The whole body RF coil 4 is arranged on the inner peripheral side of the gradient coil 2, and transmits an RF pulse to the subject S placed in the imaging space, and receives an NMR signal generated from the subject S under the influence of the RF pulse.

Specifically, the whole body RF coil 4 is formed in a substantially hollow cylindrical shape (including one in which the shape of a cross-section orthogonal to the center axis is an oval shape). On the basis of the RF pulse supplied from the transmission circuitry 6, the whole body RF coil 4 applies an RF magnetic field to the subject S placed in the imaging space that is on the inner peripheral side of the whole body RF coil 4. Then, the whole body RF coil 4 receives the NMR signal generated from the subject S under the influence of the RF magnetic field, and outputs the received NMR signal to the reception circuitry 7.

For example, the whole body RF coil 4 is a bird cage coil or a Transverse Electromagnetic (TEM) coil. The whole body RF coil 4 may not necessarily have both transmission function and reception function, and may only have a transmission function.

The local RF coil 5 is placed in the vicinity of the subject S during imaging, and transmits an RF pulse to the subject S placed in the imaging space, and receives an NMR signal generated from the subject S under the influence of the RF pulse.

Specifically, the local RF coil 5 is prepared for each part of the subject S, and is placed in the vicinity of the part to be imaged when imaging of the subject S is performed. On the basis of the RF pulse supplied from the transmission circuitry 6, the local RF coil 5 applies an RF magnetic field to the subject S.

Then, the local RF coil 5 receives the NMR signal generated from the subject S under the influence of the RF magnetic field, and outputs the received NMR signal to the reception circuitry 7. For example, the local RF coil 5 is a surface coil, or a phased array coil formed by combining surface coils as coil elements. The local RF coil 5 may not necessarily have both transmission function and reception function, and may only have a reception function.

Figure 2:
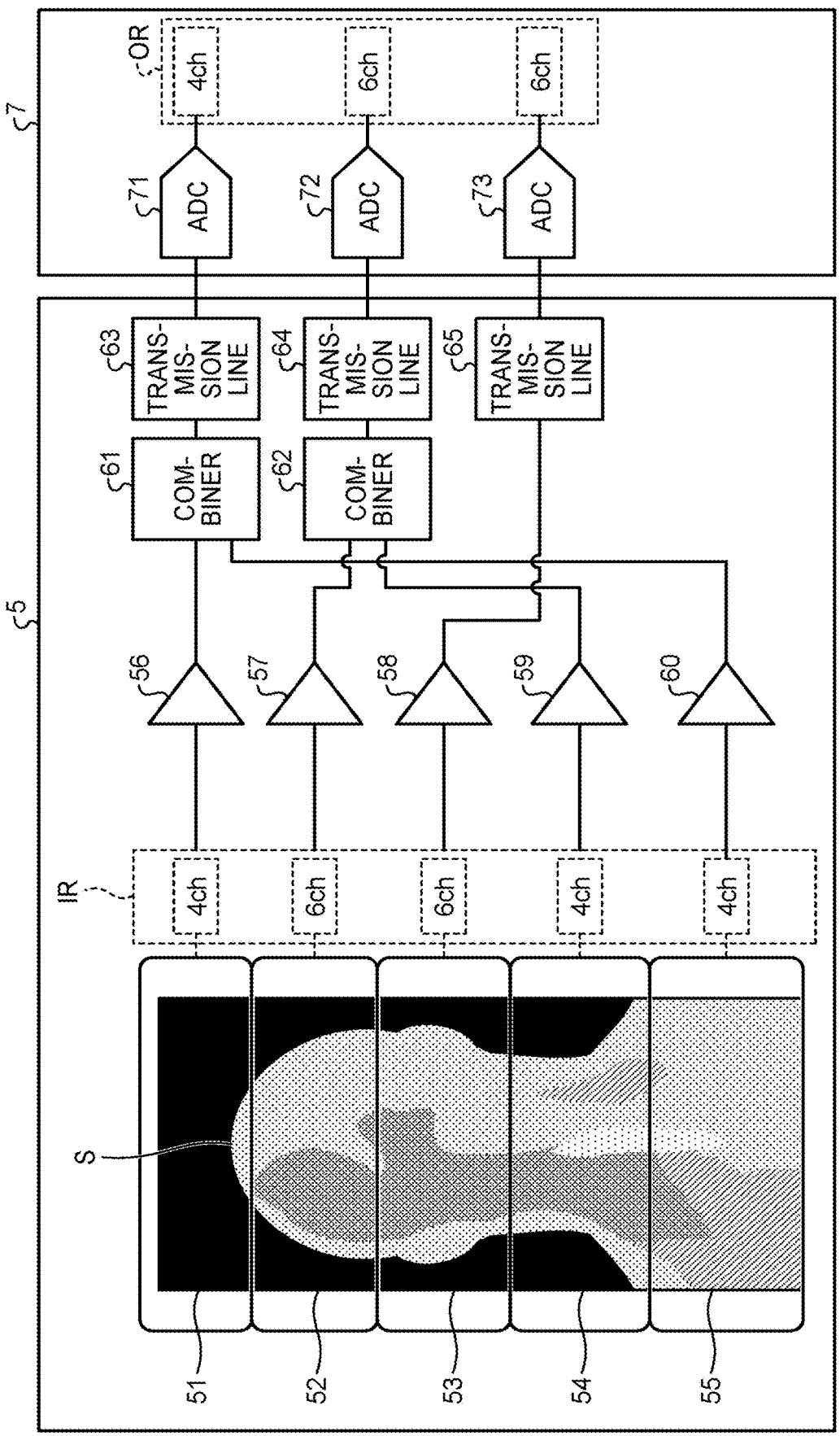
FIG. 2 is a diagram for explaining an example of a configuration of a reception system according to the embodiment.

Moreover, the local RF coil 5 has a plurality of the preamplifiers and combiners (see FIG. 2). Each of the preamplifiers amplifies the NMR signal. Each of the combiners generates a combined signal by combining two or more NMR signals amplified by the preamplifiers. The preamplifier and combiner will be described below.

The transmission circuitry 6 outputs the RF pulse corresponding to the resonance frequency (Larmor frequency) unique to a target atomic nucleus placed in the static magnetic field, to the whole body RF coil 4 or the local RF coil 5.

The reception circuitry 7 generates NMR data on the basis of the NMR signal output from the whole body RF coil 4 or the local RF coil 5, and outputs the generated NMR data to the processing circuitry 15. Moreover, the reception circuitry 7 includes a plurality of Analog to Digital converters (ADCs). Each of the ADCs converts the NMR signal output from the whole body RF coil 4 or the local RF coil 5 into digital data. The ADC is an example of a conversion unit. The ADC will be described below.

The RF shield 8 is placed between the gradient coil 2 and the whole body RF coil 4, and shields the gradient coil 2 from the RF magnetic field generated by the whole body RF coil 4. Specifically, the RF shield 8 is formed in a substantially hollow cylindrical shape (including one in which the shape of a cross-section orthogonal to the center axis of the cylinder is an oval shape). The RF shield 8 is arranged in the space on the inner peripheral side of the gradient coil 2 so as to cover the outer peripheral surface of the whole body RF coil 4.

The frame 9 has a hollow bore 9a formed in a substantially cylindrical shape (including one in which the shape of a cross-section orthogonal to the center axis is an oval shape). The frame 9 houses the static magnetic field magnet 1, the gradient coil 2, the whole body RF coil 4, and the RF shield 8.

Specifically, the frame 9 houses the whole body RF coil 4, the RF shield 8, the gradient coil 2, and the static magnetic field magnet 1, in a state in which the whole body RF coil 4 is arranged on the outer peripheral side of the bore 9a. The RF shield 8 is arranged on the outer peripheral side of the whole body RF coil 4, the gradient coil 2 is arranged on the outer peripheral side of the RF shield 8, and the static magnetic field magnet 1 is arranged on the outer peripheral side of the gradient coil 2. In this example, the space within the bore 9a of the frame 9 is the imaging space in which the subject S is placed during imaging.

The couch 10 has a couchtop 10a on which the subject S is placed, and when imaging of the subject S is performed, the couchtop 10a on which the subject S is placed is moved into the imaging space. For example, the couch 10 is installed so that the longitudinal direction of the couchtop 10a is parallel to the center axis of the static magnetic field magnet 1.

The input interface 11 receives various instructions and input operations of various types of information from the operator. Specifically, the input interface 11 is connected to the processing circuitry 17, and converts the input operation received from the operator into an electrical signal and outputs the converted electrical signal to the processing circuitry 17.

For example, the input interface 11 is implemented by a trackball, a switch button, a mouse, a keyboard, a touch pad with which an input operation can be performed by touching the operation surface, a touch screen in which a display screen and a touch pad are integrated, a non-contact input circuitry using an optical sensor, a voice input circuitry, and the like, for setting imaging conditions, a region of interest (ROI), and the like.

In the present specification, the input interface 11 is not limited to a physical operation component such as a mouse and a keyboard. For example, the input interface 11 also includes electrical signal processing circuitry that receives an electrical signal corresponding to an input operation from an external input device provided separately from the apparatus, and that outputs the electrical signal to control circuitry.

The display 12 displays various types of information. Specifically, the display 12 is connected to the processing circuitry 17, and converts and outputs data on various types of information sent from the processing circuitry 17 into electrical signals for displaying. For example, the display 12 is implemented by a liquid crystal monitor, an CRT monitor, a touch panel, and the like.

The memory 13 stores various types of data. Specifically, the memory 13 is connected to the processing circuitry 14 to 17, and stores various types of data input and output by each processing circuitry. For example, the memory 13 is implemented by a semiconductor memory element such as a random access memory (RAM) and a flash memory, a hard disk, an optical disc, and the like.

The processing circuitry 14 has a couch control function 14a. The couch control function 14a controls the operation of the couch 10 by outputting a control electrical signal to the couch 10. For example, the couch control function 14a receives an instruction to move the couchtop 10a in the longitudinal direction, the vertical direction, or the horizontal direction from the operator via the input interface 11, and operates the moving mechanism of the couchtop 10a of the couch 10 such that the couchtop 10a is moved according to the received instruction.

The processing circuitry 15 has a collection function 15a and a preamplifier control function 15b. The collection function 15a collects k-space data by executing various types of pulse sequences.

Specifically, the collection function 15a executes various types of pulse sequences by driving the gradient magnetic field power supply 3, the transmission circuitry 6, and the reception circuitry 7 according to the sequence execution data output from the processing circuitry 17.

In this example, the sequence execution data is data that represents pulse sequence, and is information that defines the timing at which the gradient magnetic field power supply 3 supplies electric current to the gradient coil 2 and the intensity of the electric current to be supplied, the timing at which the transmission circuitry 6 supplies the RF pulse to the whole body RF coil 4 and the intensity of the RF pulse to be supplied, the timing at which the reception circuitry 7 samples the NMR signal, and the like.

Then, the collection function 15a receives the NMR data output from the reception circuitry 7 as a result of executing the pulse sequence, and causes the memory 13 to store the NMR data. In this process, the NMR data stored in the memory 13 is stored as k-space data representing a two-dimensional or three-dimensional k-space, when the position information along each direction of the readout direction, the phase encode direction, and the slice direction is provided by the gradient magnet fields described above.

The preamplifier control function 15b controls the preamplifiers in the local RF coil 5. For example, the preamplifier control function 15b controls the ON/OFF of the power supply of each of the preamplifiers, according to the imaging conditions of the subject S. The process performed by the preamplifier control function 15b will be described below.

The processing circuitry 16 has a generation function 16a. The generation function 16a generates an image from the k-space data collected by the processing circuitry 15. Specifically, the generation function 16a generates a two-dimensional or three-dimensional image, by reading out the k-space data collected by the processing circuitry 15 from the memory 13, and by performing reconstruction processing such as Fourier transform on the read k-space data. Then, the generation function 16a causes the memory 13 to store the generated image.

The processing circuitry 17 has an imaging control function 17a, a reception function 17b, and a determination function 17c. The imaging control function 17a performs various types of imaging, by controlling the components of the MRI apparatus 100. Specifically, the imaging control function 17a controls the components of the MRI apparatus 100, by displaying a Graphical User Interface (GUI) for receiving various instructions and input operations of various types of information from the operator on the display 12, and according to the input operation received via the input interface 11.

For example, the imaging control function 17a causes the processing circuitry 15 to collect the k-space data, by generating sequence execution data on the basis of the imaging conditions input by the operator, and by outputting the generated sequence execution data to the processing circuitry 15. Moreover, for example, the imaging control function 17a reconstructs an image from the k-space data collected by the processing circuitry 15, by controlling the processing circuitry 16. Furthermore, for example, the imaging control function 17a reads out an image from the memory 13 according to a request from the operator, and causes the display 12 to display the read image.

The reception function 17b receives an input from the user. For example, the reception function 17b receives an input of information for setting imaging conditions and a region of interest from the user, via the input interface 11.

The determination function 17c determines the imaging conditions of the subject S. For example, the determination function 17c determines the imaging conditions including the imaging area of the subject S, on the basis of the information for setting imaging conditions and a region of interest, received by the reception function 17b. The determination function 17c may also determine the imaging conditions on the basis of examination order information and the like managed by a Hospital Information System (HIS) and the like.

In this example, each of the processing circuitry 14 to 17 described above is implemented by a processor, for example. In this case, for example, the processing function of each processing circuitry is stored in the memory 13 in the form of a computer executable program. Then, each processing circuitry implements the processing function corresponding to each computer program, by reading and executing a computer program from the memory 13. In other words, the processing circuitry in a state in which each computer program is read has each function illustrated in each processing circuitry in FIG. 1.

In this example, each processing circuitry is implemented by a single processor. However, the embodiment is not limited thereto. Each processing function may also be implemented by configuring a processing circuit by combining a plurality of independent processors, and causing each of the processors to execute a computer program. Moreover, the processing function of each processing circuitry may be implemented by being appropriately distributed or integrated into single or multiple processing circuitry.

In the example illustrated in FIG. 1, a single memory 13 stores the computer program corresponding to each processing function. However, a plurality of memories may be dispersedly arranged, and the processing circuitry may read out the corresponding computer program from individual memory.

The configuration example of the MRI apparatus 100 according to the present embodiment has been described. According to such configuration, in the present embodiment, the MRI apparatus 100 performs the process of discarding and selecting the NMR signal received from the coil element, by switching the ON/OFF of the power supply of each of the preamplifiers.

FIG. 2 is a diagram for explaining an example of a configuration of a reception system of the MRI apparatus 100 according to the embodiment.

For example, the reception system of the MRI apparatus 100 includes the local RF coil 5 (phased array coil) and the reception circuitry 7. In the following drawing, the local RF coil 5 is a head and neck coil 5.

For example, as illustrated in FIG. 2, the head and neck coil 5 includes a first coil section 51, a second coil section 52, a third coil section 53, a fourth coil section 54, a fifth coil section 55, a first preamplifier 56, a second preamplifier 57, a third preamplifier 58, a fourth preamplifier 59, a fifth preamplifier 60, a first combiner 61, a second combiner 62, a first transmission line 63, a second transmission line 64, and a third transmission line 65.

Moreover, for example, the reception circuitry 7 includes a first ADC 71, a second ADC 72, and a third ADC 73.

Furthermore, the input channel number IR in FIG. 2 represents the number of channels of each coil section (for example, the number of surface coils). Still furthermore, the output channel number OR in FIG. 2 represents the number of channels of a signal output to the processing circuitry 17.

Still furthermore, in the following drawings, when the channel within the input channel number IR is represented by the solid line box, it means that the signal is input to the first combiner 61, the second combiner 62, or the third transmission line 65. Still furthermore, similarly, when the channel of the input channel number IR is represented by the dotted line box, it means that a signal is not input to the first combiner 61, the second combiner 62, or the third transmission line 65.

In the example in FIG. 2, it is assumed that the power supplies of the first preamplifier 56 to the fifth preamplifier 60 are turned OFF. In this case, a signal is not input to the first combiner 61, the second combiner 62, or the third transmission line 65, from the first coil section 51 to the fifth coil section 55 of the head and neck coil 5. Moreover, a signal is not output to the processing circuitry 15, because no signal is input to the first combiner 61, the second combiner 62, or the third transmission line 65 from the head and neck coil 5.

What has been described above is merely an example, and the configuration of the reception system of the MRI apparatus 100 is not limited to the above. For example, the local RF coil 5 may be a body coil and the like. Moreover, for example, the number of each of the coil sections, preamplifiers, combiners, transmission lines, and ADCs may be increased or decreased.

Each configuration of the head and neck coil 5 will be described. The first coil section 51 and the second coil section 52 represent the portions of the head and neck coil 5.

For example, the first coil section 51 is used for head imaging. A plurality of surface coils are arranged in the first coil section 51. In the example in FIG. 2, four surface coils are arranged in the first coil section 51 (four channels).

Moreover, for example, the second coil section 52 is used for head imaging. A plurality of surface coils are arranged in the second coil section 52. In the example in FIG. 2, six surface coils are arranged in the second coil section 52 (six channels).

Furthermore, for example, the third coil section 53 is used for head and neck imaging. A plurality of surface coils are arranged in the third coil section 53. In the example in FIG. 2, six surface coils are arranged in the third coil section 53 (six channels).

Still furthermore, for example, the fourth coil section 54 is used for neck imaging. A plurality of surface coils are arranged in the fourth coil section 54. In the example in FIG. 2, four surface coils are arranged in the fourth coil section 54 (four channels).

Still furthermore, for example, the fifth coil section 55 is used for neck and spine imaging. A plurality of surface coils are arranged in the fifth coil section 55. In the example in FIG. 2, four surface coils are arranged in the fifth coil section 55 (four channels).

Each of the first preamplifier 56 to the fifth preamplifier 60 is connected to each of the first coil section 51 to the fifth coil section 55 via the input channel with the number of channels corresponding to the coil section, and amplifies the NMR signal received by each coil section.

For example, the first preamplifier 56 amplifies the NMR signals received by the surface coils disposed in the first coil section 51, and outputs the amplified NMR signals to the first combiner 61. Moreover, the first preamplifier 56 includes a switch (not illustrated) to turn ON/OFF the power supply of the first preamplifier 56. In the example in FIG. 2, the power supplies of the first preamplifier 56 to the fifth preamplifier 60 are turned OFF.

Moreover, for example, the second preamplifier 57 amplifies the NMR signals received by the surface coils disposed in the second coil section 52, and outputs the amplified NMR signals to the second combiner 62. Furthermore, the second preamplifier 57 includes a switch (not illustrated) to turn ON/OFF the power supply of the second preamplifier 57.

Still furthermore, for example, the third preamplifier 58 amplifies the NMR signals received by the surface coils disposed in the third coil section 53. Still furthermore, the third preamplifier 58 outputs the amplified NMR signals to the third transmission line 65. Still furthermore, the third preamplifier 58 includes a switch (not illustrated) to turn ON/OFF the power supply of the third preamplifier 58.

Still furthermore, for example, the fourth preamplifier 59 amplifies the NMR signals received by the surface coils disposed in the fourth coil section 54, and outputs the amplified NMR signals to the second combiner 62. Still furthermore, the fourth preamplifier 59 includes a switch (not illustrated) to turn ON/OFF the power supply of the fourth preamplifier 59.

Still furthermore, for example, the fifth preamplifier 60 amplifies the NMR signals received by the surface coils disposed in the fifth coil section 55, and outputs the amplified NMR signals to the first combiner 61. Still furthermore, the fifth preamplifier 60 includes a switch (not illustrated) to turn ON/OFF the power supply of the fifth preamplifier 60.

The first combiner 61 and the second combiner 62 are each connected to each pair of preamplifiers that are paired among the first preamplifier 56 to the fifth preamplifier 60, and generate a combined signal obtained by combining the NMR signals amplified by the preamplifiers.

For example, when the power supplies of the first preamplifier 56 and the fifth preamplifier 60 are turned ON, the first combiner 61 generates a first combined signal (four channels) by combining the NMR signal (four channels) amplified by the first preamplifier 56 (hereinafter, may also be referred to as a first amplified NMR signal) and the NMR signal (four channels) amplified by the fifth preamplifier 60 (hereinafter, may also be referred to as a fifth amplified NMR signal). Moreover, the first combiner 61 outputs the first combined signal having been combined to the first transmission line 63.

Furthermore, for example, when the power supply of the first preamplifier 56 is turned ON and when the power supply of the fifth preamplifier 60 is turned OFF, the first combiner 61 outputs the first amplified NMR signal to the first transmission line 63. Still furthermore, when the power supply of the first preamplifier 56 is turned OFF and when the power supply of the fifth preamplifier 60 is turned ON, the first combiner 61 outputs the fifth amplified NMR signal to the first transmission line 63.

For example, when the power supplies of the second preamplifier 57 and the fourth preamplifier 59 are turned ON, the second combiner 62 generates a second combined signal (six channels), by combining the NMR signal (six channels) amplified by the second preamplifier 57 (hereinafter, may also be referred to as a second amplified NMR signal) and the NMR signal (four channels) amplified by the fourth preamplifier 59 (hereinafter, may also be referred to as a fourth amplified NMR signal). Moreover, the second combiner 62 outputs the second combined signal having been combined to the second transmission line 64.

Furthermore, for example, when the power supply of the second preamplifier 57 is turned ON and when the power supply of the fourth preamplifier 59 is turned OFF, the second combiner 62 outputs the second amplified NMR signal to the second transmission line 64. Still furthermore, when the power supply of the second preamplifier 57 is turned OFF and when the power supply of the fourth preamplifier 59 is turned ON, the second combiner 62 outputs the fourth amplified NMR signal to the second transmission line 64.

In FIG. 2, the first coil section 51 is paired with the fifth coil section 55, and the second coil section 52 is paired with the fourth coil section 54. However, a method of forming pairs is not limited thereto. However, it is preferable to pair the coil sections that are less frequently used together during imaging.

The following describes the reason why the first coil section 51 is paired with the fifth coil section 55 as described above.

For example, from experience, it is known that the first coil section 51 and the second coil section 52 are frequently used together when imaging the head. When head imaging is performed by pairing the first coil section 51 with the second coil section 52, a combined signal of four channels is generated by combining the NMR signal of the four channels and the NMR signal of the six channels. In this manner, when the combined signal with the number of channels less than the total of the original number of channels is generated, the signal-to-noise (S/N) ratio is reduced. Hence, image quality degradation will most likely occur.

Therefore, by pairing the coil sections that are less frequently used together, it is possible to reduce the composite frequency, and prevent image quality degradation due to a reduction in the S/N ratio. Therefore, in the present embodiment, the first coil section 51 is paired with the fifth coil section 55 that is least frequently used together with the first coil section 51 from experience.

Moreover, the second coil section 52 is paired with the fourth coil section 54 that is least frequently used together with the second coil section 52, excluding the first coil section 51 and the fifth coil section 55.

In this example, being adjacent to each other, the second coil section 52 and the third coil section 53 are frequently used together, for example. That is, when the second coil section 52 is paired with the third coil section 53, the probability of the NMR signals being combined will be increased. Hence, image quality degradation due to a reduction in the S/N ratio tend to occur easily.

Therefore, with the configuration described above, it is possible to reduce the probability of the NMR signals being combined. As a result, it is possible to improve the S/N ratio, and improve the image quality.

The first transmission line 63 to the third transmission line 65 transmit signals to the reception circuitry 7.

For example, the first transmission line 63 transmits the first combined signal (four channels) combined by the first combiner 61, the first amplified NMR signal (four channels), or the fifth amplified NMR signal (four channels), to the first ADC 71 in the reception circuitry 7.

For example, the second transmission line 64 transmits the second combined signal (six channels) combined by the second combiner 62, the second amplified NMR signal (six channels), or the fourth amplified NMR signal (four channels), to the second ADC 72 in the reception circuitry 7.

The third transmission line 65 transmits the NMR signal (six channels) amplified by the third preamplifier 58 (hereinafter, may also be referred to as a third amplified NMR signal), to the third ADC 73 in the reception circuitry 7.

Next, each configuration of the reception circuitry 7 will be described. The first ADC 71 to the third ADC 73 convert an analog signal transmitted from the local RF coil 5 into a digital signal.

For example, the first ADC 71 generates first NMR data (four channels) by converting the first combined signal transmitted from the first transmission line 63, from an analog signal into a digital signal. In the example in FIG. 2, the first ADC 71 includes four ADCs (four channels).

Moreover, for example, the first ADC 71 generates first NMR data (four channels) by converting the first amplified NMR signal transmitted from the first transmission line 63, from an analog signal into a digital signal. Furthermore, for example, the first ADC 71 generates the first NMR data (four channels) by converting the fifth amplified NMR signal transmitted from the first transmission line 63, from an analog signal into a digital signal.

Still furthermore, for example, the first ADC 71 outputs the generated first NMR data to the processing circuitry 15.

For example, the second ADC 72 generates second NMR data (six channels) by converting the second combined signal transmitted from the second transmission line 64, from an analog signal into a digital signal. In the example in FIG. 2, the second ADC 72 includes six ADCs (six channels).

Moreover, for example, the second ADC 72 generates the second NMR data (six channels) by converting the second amplified NMR signal transmitted from the second transmission line 64, from an analog signal into a digital signal. Furthermore, for example, the second ADC 72 generates second NMR data (four channels) by converting the fourth amplified NMR signal transmitted from the second transmission line 64, from an analog signal into a digital signal.

Still furthermore, for example, the second ADC 72 outputs the generated NMR data to the processing circuitry 15.

For example, the third ADC 73 generates third NMR data (six channels) by converting the third amplified NMR signal transmitted from the third transmission line 65, from an analog signal into a digital signal. In the example in FIG. 2, the third ADC 73 includes six ADCs (six channels).

Moreover, for example, the third ADC 73 outputs the generated third NMR data to the processing circuitry 15.

On the other hand, the preamplifier control function 15b of the processing circuitry 15 switches the number of detection channels of the head and neck coil 5, by controlling the head and neck coil 5 having the configuration described above. Specifically, the preamplifier control function 15b selects a plurality of coil sections to be used for imaging, from the first coil section 51 to the fifth coil section 55, according to the imaging conditions of the subject S determined by the determination function 17c of the processing circuitry 17.

Then, the preamplifier control function 15b controls the switch corresponding to each of the first preamplifier 56 to the fifth preamplifier 60 according to the selected coil section, and turns ON/OFF the power supply of each of the first preamplifier 56 to the fifth preamplifier 60.

Figure 3:
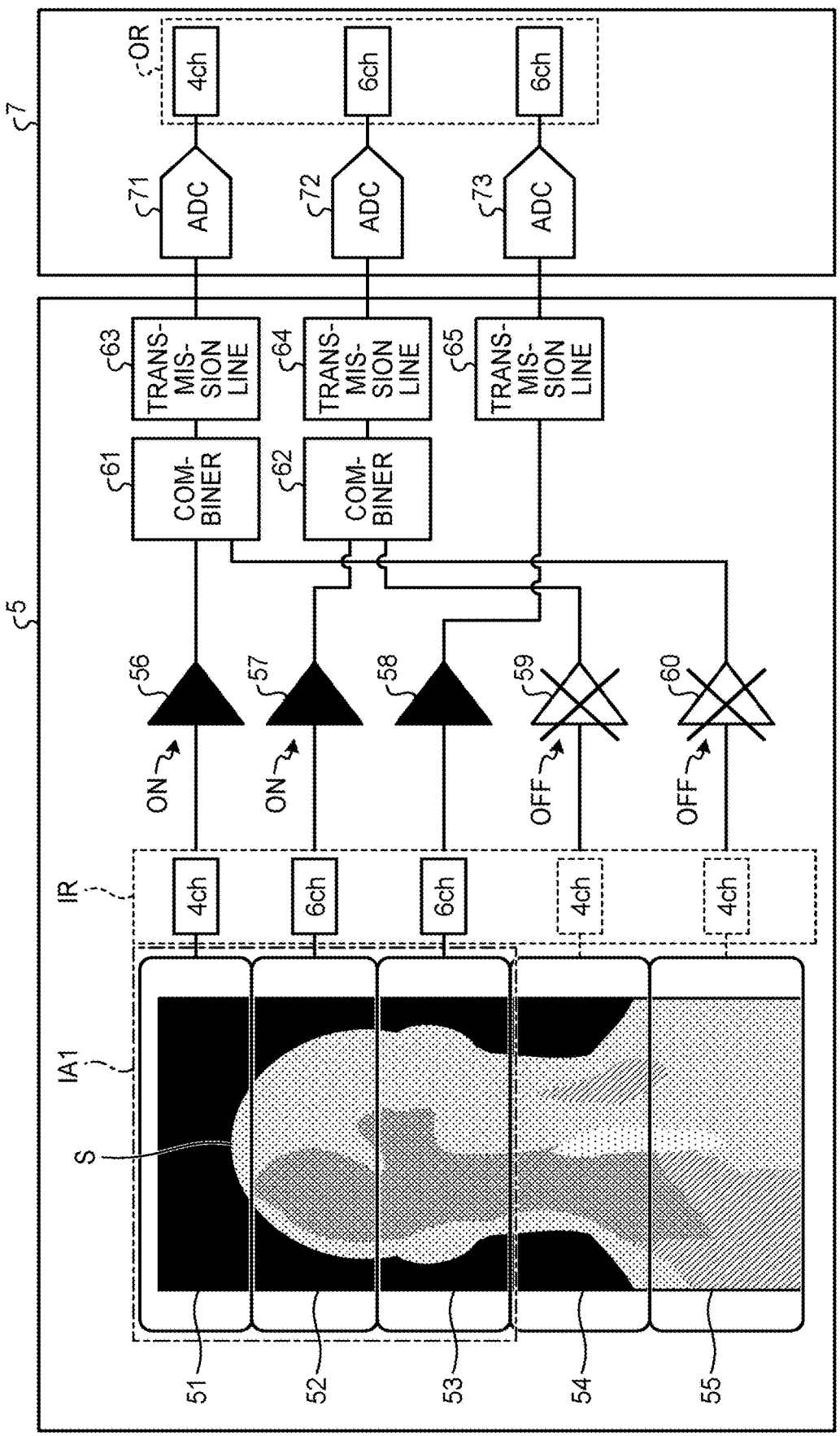
FIG. 3 is a diagram for explaining an example of a relation between the selection of a coil section and the control of the power supply of a preamplifier according to the embodiment.

Hereinafter, with reference to FIG. 3 to FIG. 5, a relation between the selection of the coil section and the ON/OFF state of the power supply of the preamplifier will be described. FIG. 3 is a diagram for explaining an example of a relation between the selection of a coil section and the control of the power supply of a preamplifier in head imaging.

First, as a prerequisite, it is assumed that the determination function 17c of the processing circuitry 17 has determined that an area IA1 represented by the dashed line box in FIG. 3 as the imaging area of the subject S. Moreover, it is assumed that the power supplies of the first preamplifier 56 to the fifth preamplifier 60 are all in OFF state.

In this case, the preamplifier control function 15b of the processing circuitry 15 selects the first coil section 51, the second coil section 52, and the third coil section 53 as the coil sections to be used for imaging, to capture an image of the head of the subject S.

After selecting the coil sections, as illustrated in FIG. 3, the preamplifier control function 15b controls the switch corresponding to each of the first preamplifier 56, the second preamplifier 57, and the third preamplifier 58, and turns the power supply ON. Moreover, the preamplifier control function 15b does not control the switch corresponding to each of the fourth preamplifier 59 and the fifth preamplifier 60, and maintains the OFF state of the power supply.

In this case, the first preamplifier 56 outputs the first amplified NMR signal (four channels) that is obtained by amplifying the NMR signals received by the surfaces coils of the first coil section 51, to the first combiner 61. Moreover, the second preamplifier 57 outputs the second amplified NMR signal (six channels) that is obtained by amplifying the NMR signals received by the surface coils of the second coil section 52, to the second combiner 62.

Furthermore, the third preamplifier 58 outputs the third amplified NMR signal (six channels) that is obtained by amplifying the NMR signals received by the surface coils of the third coil section 53, to the third transmission line 65. On the other hand, because the power supplies of the fourth preamplifier 59 and the fifth preamplifier 60 are turned OFF, no NMR signal is amplified or output.

The first combiner 61 outputs the first amplified NMR signal (four channels) to the first transmission line 63. This is because an NMR signal is not output from the fifth preamplifier 60 that is connected to the first combiner 61 with the first preamplifier 56, and the NMR signals are not combined.

The second combiner 62 outputs the second amplified NMR signal (six channels) to the second transmission line 64. This is because an NMR signal is not output from the fourth preamplifier 59 that is connected to the second combiner 62 with the second preamplifier 57, and the NMR signals are not combined.

The first transmission line 63 transmits the first amplified NMR signal (four channels) input from the first combiner 61, to the first ADC 71 in the reception circuitry 7. The second transmission line 64 transmits the second amplified NMR signal (six channels) input from the second combiner 62, to the second ADC 72 in the reception circuitry 7. The third transmission line 65 transmits the third amplified NMR signal (six channels) input from the third preamplifier 58, to the third ADC 73 in the reception circuitry 7.

The first ADC 71 generates the first NMR data (four channels) by converting the first amplified NMR signal transmitted from the first transmission line 63, from an analog signal into a digital signal. Then, on the basis of the first amplified NMR signal, the first ADC 71 outputs the generated first NMR data to the processing circuitry 15.

The second ADC 72 generates the second NMR data (six channels) by converting the second amplified NMR signal transmitted from the second transmission line 64, from an analog signal into a digital signal. Then, on the basis of the second NMR signal, the second ADC 72 outputs the generated second NMR data to the processing circuitry 15.

The third ADC 73 generates the third NMR data (six channels) by converting the third amplified NMR signal transmitted from the third transmission line 65, from an analog signal into a digital signal. Then, on the basis of the third NMR signal, the third ADC 73 outputs the generated third NMR data to the processing circuitry 15.

Then, among the NMR signals of the first coil section 51 to the fifth coil section 55, the preamplifier control function 15b of the processing circuitry 15 thins out the NMR signals of the fourth coil section 54 (four channels) and the fifth coil section 55 (four channels) that are not used for head imaging.

In this manner, the preamplifier control function 15b can control the ON/OFF of the power supplies of the first preamplifier 56 to the fifth preamplifier 60 according to the head serving as the imaging area, and can make the NMR signals to be output to the reception circuitry 7 to 16 channels or less that are the total number of channels of the first ADC 71 to the third ADC 73 (in the example in FIG. 3, 16 channels). As a result, the preamplifier control function 15b can prevent image quality degradation due to a reduction in the S/N ratio.

Next, neck and spine imaging will be described. FIG. 4 is a diagram for explaining an example of a relation between the selection of a coil section and the control of the power supply of a preamplifier in neck and spine imaging.

Figure 4:
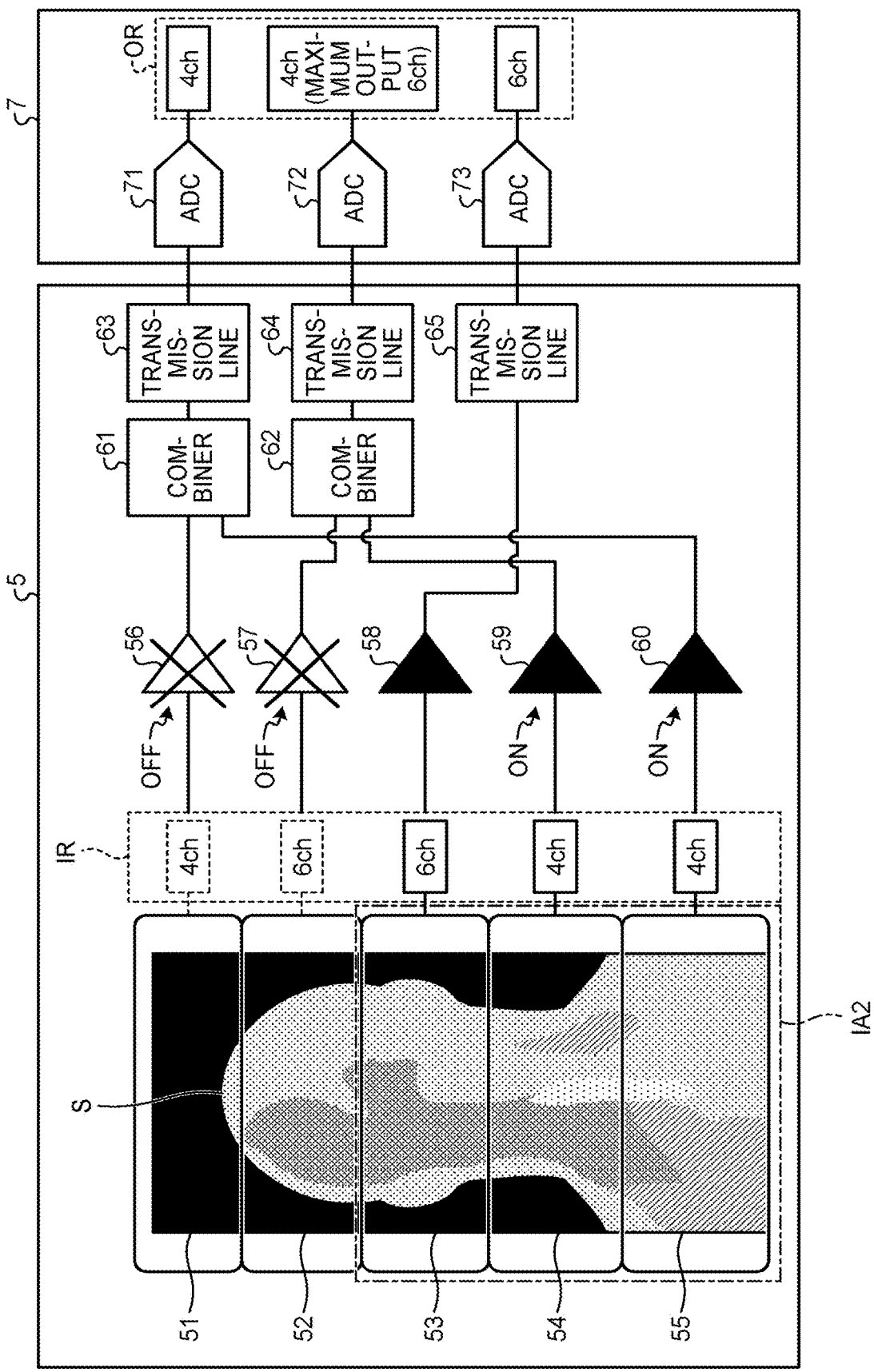
FIG. 4 is a diagram for explaining an example of a relation between the selection of a coil section and the control of the power supply of a preamplifier according to the embodiment.

First, as a prerequisite, it is assumed that the determination function 17c of the processing circuitry 17 has determined that an area IA2 represented by the dashed line box in FIG. 4 as the imaging area of the subject S. Moreover, it is assumed that the power supplies of the first preamplifier 56 to the fifth preamplifier 60 are all in OFF state.

In this case, the preamplifier control function 15b of the processing circuitry 15 selects the third coil section 53, the fourth coil section 54, and the fifth coil section 55 as the coil sections to be used for imaging.

Then, after selecting the coil sections, as illustrated in FIG. 4, the preamplifier control function 15b controls the switch corresponding to each of the third preamplifier 58, the fourth preamplifier 59, and the fifth preamplifier 60, and turns the power supply ON. On the other hand, the preamplifier control function 15b does not control the switch corresponding to each of the first preamplifier 56 and the second preamplifier 57, and maintains the OFF state of the power supply.

In this case, the fifth preamplifier 60 outputs the fifth amplified NMR signal (four channels) that is obtained by amplifying the NMR signals received by the surfaces coils of the fifth coil section 55, to the first combiner 61. Moreover, the fourth preamplifier 59 outputs the fourth amplified NMR signal (four channels) that is obtained by amplifying the NMR signals received by the surface coils of the fourth coil section 54, to the second combiner 62.

Furthermore, the third preamplifier 58 outputs the third amplified NMR signal (six channels) that is obtained by amplifying the NMR signals received by the surface coils of the third coil section 53, to the third transmission line 65. On the other hand, because the power supplies of the first preamplifier 56 and the second preamplifier 57 are turned OFF, no NMR signal is amplified or output.

The first combiner 61 outputs the fifth amplified NMR signal (four channels) to the first transmission line 63. This is because an NMR signal is not output from the first preamplifier 56 that is connected to the first combiner 61 with the fifth preamplifier 60, and the NMR signals are not combined.

The second combiner 62 outputs the fourth amplified NMR signal (four channels) to the second transmission line 64. This is because an NMR signal is not output from the second preamplifier 57 that is connected to the second combiner 62 with the fourth preamplifier 59, and the NMR signals are not combined.

The first transmission line 63 transmits the fifth amplified NMR signal (four channels) input from the first combiner 61, to the first ADC 71 in the reception circuitry 7. The second transmission line 64 transmits the fourth amplified NMR signal (four channels) input from the second combiner 62, to the second ADC 72 in the reception circuitry 7. The third transmission line 65 transmits the third amplified NMR signal (six channels) input from the third preamplifier 58, to the third ADC 73 in the reception circuitry 7.

The first ADC 71 generates the first NMR data (four channels) by converting the fifth amplified NMR signal transmitted from the first transmission line 63, from an analog signal into a digital signal. Then, on the basis of the fifth amplified NMR signal, the first ADC 71 outputs the generated first NMR data to the processing circuitry 15.

The second ADC 72 generates the second NMR data (four channels) by converting the fourth amplified NMR signal transmitted from the second transmission line 64, from an analog signal into a digital signal. Then, on the basis of the fourth amplified NMR signal, the second ADC 72 outputs the generated second NMR data to the processing circuitry 15.

The third ADC 73 generates the third NMR data (six channels) by converting the third amplified NMR signal transmitted from the third transmission line 65, from an analog signal into a digital signal. Then, on the basis of the third amplified NMR signal, the third ADC 73 outputs the generated third NMR data to the processing circuitry 15.

In the example in FIG. 4, among the NMR signals of the first coil section 51 to the fifth coil section 55, the preamplifier control function 15b thins out the NMR signals of the first coil section 51 (four channels) and the second coil section 52 (six channels) that are not used for neck and spine imaging.

In this manner, the preamplifier control function 15b can control the ON/OFF of the power supplies of the first preamplifier 56 to the fifth preamplifier 60 according to the neck serving as the imaging area, and can make the NMR signals to be output to the reception circuitry 7 to 16 channels or less (in the example in FIG. 4, 14 channels). As a result, the preamplifier control function 15b can prevent image quality degradation due to a reduction in the S/N ratio.

Next, Neurovascular (NV) imaging will be described. FIG. 5 is a diagram for explaining an example of a relation between the selection of a coil section and the control of the power supply of a preamplifier in neck and spine imaging.

Figure 5:
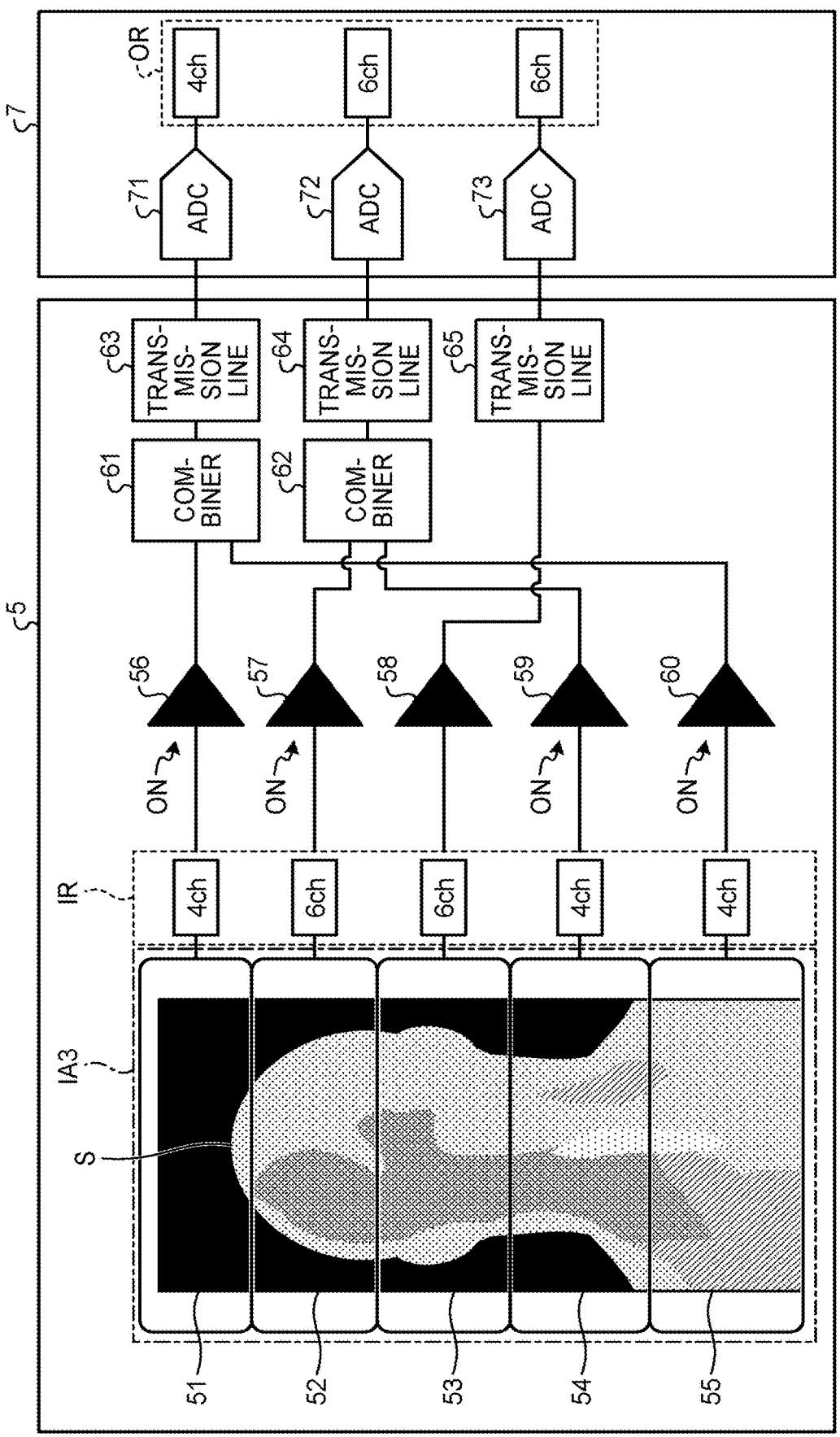
FIG. 5 is a diagram for explaining an example of a relation between the selection of a coil section and the control of the power supply of a preamplifier according to the embodiment.

First, as a prerequisite, it is assumed that the determination function 17c of the processing circuitry 17 has determined that an area IA3 represented by the dashed line box in FIG. 5 as the imaging area of the subject S. Moreover, it is assumed that the power supplies of the first preamplifier 56 to the fifth preamplifier 60 are all in OFF state.

In this case, the preamplifier control function 15b of the processing circuitry 15 selects the first coil section 51, the second coil section 52, the third coil section 53, the fourth coil section 54, and the fifth coil section 55 as the coil sections to be used for imaging.

After selecting the coil sections, as illustrated in FIG. 5, the preamplifier control function 15b controls the switch corresponding to each of the first preamplifier 56, the second preamplifier 57, the third preamplifier 58, the fourth preamplifier 59, and the fifth preamplifier 60, and turns the power supply ON.

In this case, the first preamplifier 56 outputs the first amplified NMR signal (four channels) that is obtained by amplifying the NMR signals received by the surfaces coils of the first coil section 51, to the first combiner 61. Moreover, the fifth preamplifier 60 outputs the fifth amplified NMR signal (four channels) that is obtained by amplifying the NMR signals received by the surface coils of the fifth coil section 55, to the first combiner 61.

Furthermore, the second preamplifier 57 outputs the second amplified NMR signal (six channels) that is obtained by amplifying the NMR signals received by the surface coils of the second coil section 52, to the second combiner 62. Still furthermore, the fourth preamplifier 59 outputs the fourth amplified NMR signal (four channels) that is obtained by amplifying the NMR signals received by the surface coils of the fourth coil section 54, to the second combiner 62.

Still furthermore, the third preamplifier 58 outputs the third amplified NMR signal (six channels) that is obtained by amplifying the NMR signals received by the surface coils of the third coil section 53, to the third transmission line 65.

The first combiner 61 generates the first combined signal (four channels), by combining the first amplified NMR signal (four channels) and the fifth amplified NMR signal (four channels). The first combiner 61 outputs the generated first combined signal to the first transmission line 63. The second combiner 62 generate the second combined signal (six channels), by combining the second amplified NMR signal (six channels) and the fourth amplified NMR signal (four channels). The second combiner 62 outputs the generated second combined signal to the second transmission line 64.

The first transmission line 63 transmits the first combined signal (four channels) input from the first combiner 61, to the first ADC 71 in the reception circuitry 7. The second transmission line 64 transmits the second combined signal (six channels) input from the second combiner 62, to the second ADC 72 in the reception circuitry 7. The third transmission line 65 transmits the third amplified NMR signal (six channels) input from the third preamplifier 58, to the third ADC 73 in the reception circuitry 7.

The first ADC 71 generates the first NMR data (four channels) by converting the first combined signal (four channels) transmitted from the first transmission line 63, from an analog signal into a digital signal. Then, on the basis of the first combined signal, the first ADC 71 outputs the generated first NMR data to the processing circuitry 15.

The second ADC 72 generates the second NMR data (six channels) by converting the second combined signal (six channels) transmitted from the second transmission line 64, from an analog signal into a digital signal. Then, on the basis of the second combined signal, the second ADC 72 outputs the generated second NMR data to the processing circuitry 15.

The third ADC 73 generates the third NMR data by converting the third amplified NMR signal (six channels) transmitted from the third transmission line 65, from an analog signal into a digital signal. Then, on the basis of the third amplified NMR signal, the third ADC 73 outputs the generated third NMR data (six channels), to the processing circuitry 15.

In the example in FIG. 5, the preamplifier control function 15b controls to turn ON the power supplies of the first preamplifier 56 and the fifth preamplifier 60. Moreover, similarly, the preamplifier control function 15b controls to turn ON the power supplies of the second preamplifier 57 and the fourth preamplifier 59.

In this manner, when the preamplifier control function 15b controls the first combiner 61 and the second combiner 62 to generate the first combined signal and second combined signal, it is possible to receive the NMR signals of 24 channels from the coil sections. That is, the preamplifier control function 15b controls the ON/OFF of the power supplies of the first preamplifier 56 to the fifth preamplifier 60, so as the NMR signals can be received from the coil sections with the number of channels exceeding the number of channels of the ADC included in the reception circuitry 7.

Figure 6:
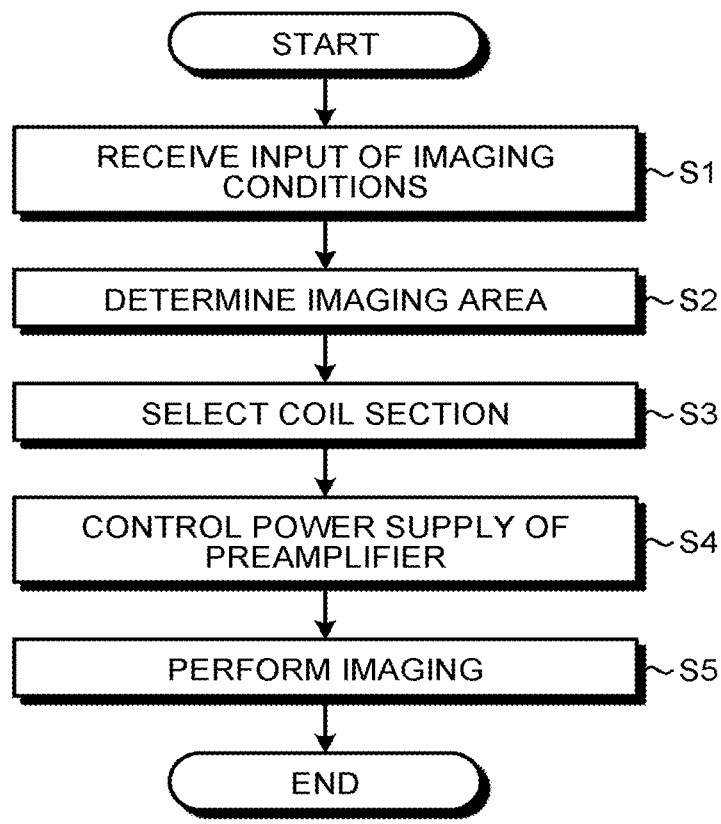
FIG. 6 is a flowchart illustrating an example of a process performed by the MRI apparatus according to the embodiment.

Hereinafter, a process performed by the MRI apparatus 100 according to the present embodiment will be described. FIG. 6 is a flowchart illustrating an example of a process performed by the MRI apparatus 100 according to the present embodiment.

First, the reception function 17b of the processing circuitry 17 receives an input such as imaging conditions from the user (step S1). For example, the reception function 17b receives an input for setting imaging conditions and a region of interest of the subject S from the user, via the input interface 11.

Next, the determination function 17c determines the imaging area of the subject S, according to the input such as the imaging conditions received at step S1 (step S2). For example, the determination function 17c determines the body part of the subject S corresponding to the input for setting the region of interest of the subject S received from the user as the imaging area.

Next, the preamplifier control function 15b of the processing circuitry 15 selects the coil sections to be used for imaging, according to the imaging area of the subject S determined at step S2 (step S3).

Next, the preamplifier control function 15b controls the ON/OFF of the power supply of each of the preamplifiers, according to the coil sections selected at step S3 (step S4). For example, the preamplifier control function 15b controls the switch of the preamplifier corresponding to each of the selected coil sections, and turns ON the power supply.

Next, the imaging control function 17a of the processing circuitry 17 performs imaging of the subject S according to the imaging conditions received at step S2 and the imaging area determined at step S3 (step S5), and terminates the present process.

As described above, the MRI apparatus 100 according to the present embodiment includes the first coil section 51 to the fifth coil section 55 including the surface coils, the first preamplifier 56 to the fifth preamplifier 60 that amplify the NMR signal received by each of the surface coils of each coil section, the first combiner 61 and the second combiner 62 that generate the combined signal by combining two or more amplified NMR signals amplified by the preamplifiers, and the first ADC 71 to the third ADC 73 that convert an analog signal into a digital signal. Moreover, the MRI apparatus 100 according to the present embodiment controls the ON/OFF of each preamplifier according to the imaging conditions of the subject S.

As a result, for example, if there is an unnecessary coil section in the specific imaging conditions, the MRI apparatus 100 according to the present embodiment can turn OFF the power supply of the preamplifier corresponding to the coil section, and thin out the NMR signal from the coil section. In this case, a combined signal will not be generated. That is, even if the local RF coil 5 with the number of channels greater than those of the first ADC 71 to the third ADC 73 is used, if there is an unnecessary coil section in the specific imaging conditions, the MRI apparatus 100 according to the present embodiment can prevent a reduction in the S/N ratio by the signal composite, and prevent the corresponding image quality degradation.

On the other hand, for example, if it is necessary to use all coil sections in the specific imaging conditions, the MRI apparatus 100 according to the present embodiment controls the ON/OFF of the power supply of each preamplifier, and generates a combined signal by combining two or more NMR signals. As a result, the MRI apparatus 100 according to the present embodiment can receive the NMR signals from the surface coils with the number of channels greater than those of the first ADC 71 to the third ADC 73.

Moreover, for the main body (portion excluding the RF coil) of the MRI apparatus, the MRI apparatus 100 according to the present embodiment can be implemented without adding hardware to the MRI apparatus having a conventional configuration. Hence, the configuration in which the RF coil with the increased number of channels is used can be implemented at a low cost.

Furthermore, the MRI apparatus 100 according to the present embodiment controls the ON/OFF of the power supply of each preamplifier according to the imaging area of the subject S. As a result, for example, the MRI apparatus 100 according to the present embodiment can thin out the NMR signal or combine two or more NMR signals, according to the size of the imaging area.

The embodiment described above can also be appropriately modified and implemented by changing a part of the configuration or function of each of the apparatuses. Therefore, in the following, some modifications according to the embodiment described above will be described as other embodiments. In the following, points different from the above-described embodiment will be mainly described, and detailed description of the same points as those described above will be omitted. Moreover, the following modification may be implemented individually or in combination as appropriate.

First Modification

In the embodiment described above, the pair of the coil sections is fixed. However, the pair of the coil sections may be switched according to the installation orientation of the local RF coil 5.

Figure 7:
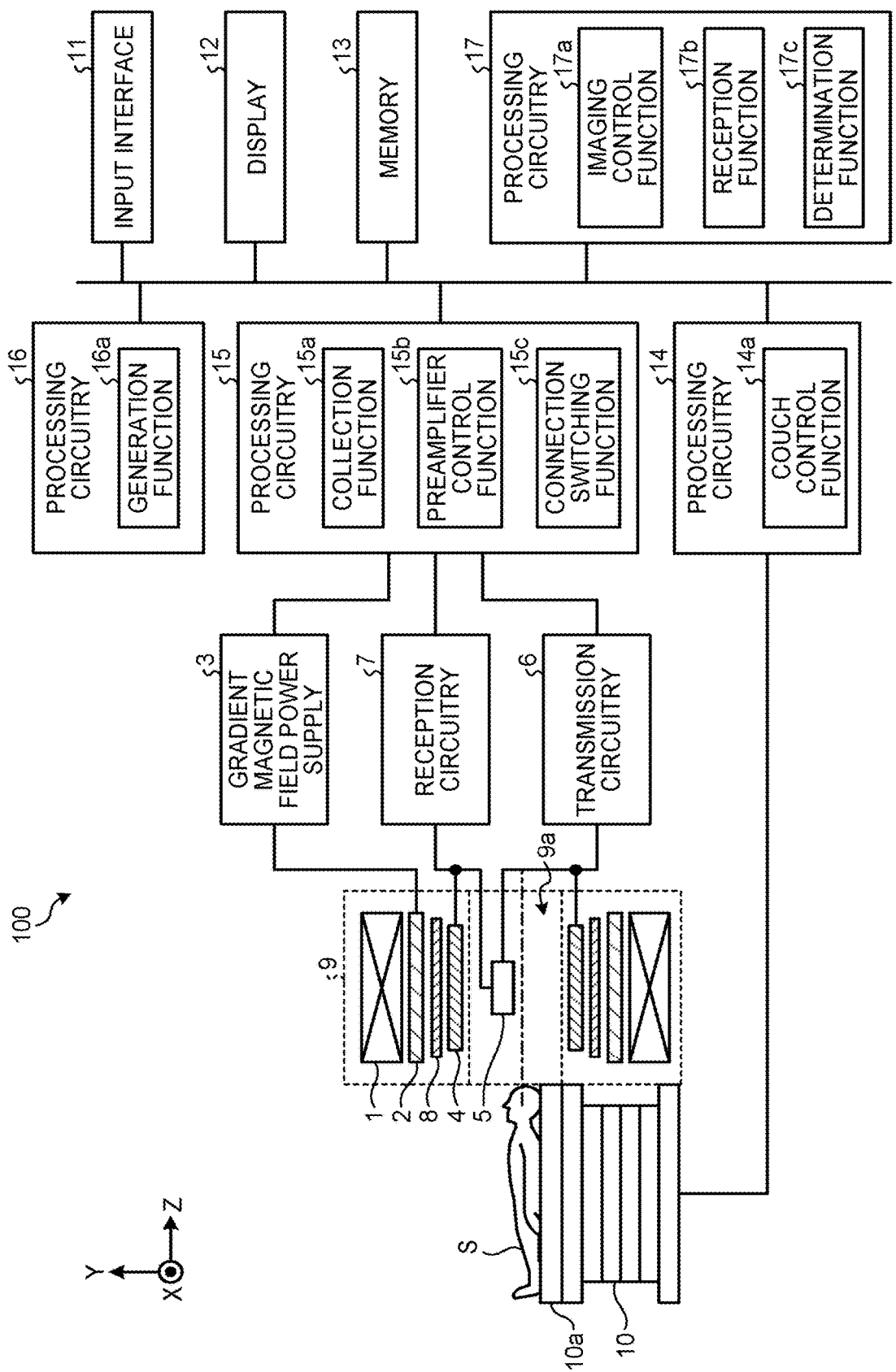
FIG. 7 is a block diagram illustrating an example of a configuration of an MRI apparatus according to a modification.

In this example, FIG. 7 is a block diagram illustrating an example of a configuration of the MRI apparatus 100 according to a first modification. The processing circuitry 15 of the MRI apparatus 100 according to the present modification has a connection switching function 15c.

The connection switching function 15c switches the connection destination of the preamplifiers. In the present modification, the local RF coil 5 includes a changeover switch (not illustrated) for switching the connection of each of the preamplifiers between the combiners or between the transmission lines.

For example, the connection switching function 15c specifies the installation orientation of the local RF coil 5 on the basis of the imaging conditions of the subject S. Moreover, the connection switching function 15c performs the process of switching the connection destination of the preamplifiers, on the basis of the installation orientation of the specified local RF coil 5 and the specification table stored in the memory 13 and the like.

Hereinafter, the specification table will be described with reference to FIG. 8. FIG. 8 is a diagram for explaining an example of a specification table according to the first modification. In the present modification, it is assumed that a specification table 13a is stored in the memory 13.

For example, the specification table 13a is a data table in which the coil type, the coil orientation, and the pair are associated with each other. The coil type is information indicating the type of the local RF coil 5 (for example, a body coil and the like.). The coil orientation is information indicating the installation orientation of the local RF coil 5 in imaging the subject S. The pair is information indicating a combination of the coil sections to be paired.

In the example in FIG. 8, the local RF coil 5 referred to as an "A coil" includes the first coil section to the sixth coil section, and includes the first preamplifier to the sixth preamplifier, the first combiner, the second combiner, and the first transmission line to the fourth transmission line. Moreover, it is assumed that the first combiner is connected to the first transmission line, and the second combiner is connected to the second transmission line.

Furthermore, it is assumed that the changeover switch of the first preamplifier switches the connection of the first preamplifier between the first combiner and the second combiner, or between the third transmission line and the fourth transmission line. The changeover switch of the second preamplifier to the sixth preamplifier is the same as that of the first preamplifier. Hence, the description thereof will be omitted.

In this case, if the A coil is installed in the X direction, the first row and the second row in FIG. 8 indicate that the first coil section is paired with the sixth coil section, and the second coil section is paired with the fifth coil section.

Similarly, if the A coil is installed in the Y direction, the third row and the fourth row in FIG. 8 indicate that the first coil section is paired with the fifth coil section, and the second coil section is paired with the fourth coil section.

Similarly, if the A coil is installed in the Z direction, the fifth row and the sixth row in FIG. 8 indicate that the second coil section is paired with the sixth coil section, and the third coil section is paired with the fifth coil section.

In this example, to capture an image of the subject S, the A coil is installed in the X direction, for example. In this case, the connection switching function 15c specifies that the A coil is used for imaging and the A coil is installed in the X direction, from the imaging conditions of the subject S. Next, the connection switching function 15c refers to the specification table 13a, and specifies the first coil section and the sixth coil section, and the second coil section and the fifth coil section as the coil sections to be paired, corresponding to the case where the A coil is installed in the X direction.

Next, the connection switching function 15c controls the changeover switch of the first preamplifier, and sets the connection destination of the first preamplifier to be the first combiner. Moreover, the connection switching function 15c controls the changeover switch of the second preamplifier, and sets the connection destination of the second preamplifier to be the first combiner.

Furthermore, the connection switching function 15c controls the changeover switch of the third preamplifier, and sets the connection destination of the third preamplifier to be the third transmission line. Still furthermore, the connection switching function 15c controls the changeover switch of the fourth preamplifier, and sets the connection destination of the fourth preamplifier to be the fourth transmission line.

Still furthermore, the connection switching function 15c controls the changeover switch of the fifth preamplifier, and sets the connection destination of the fifth preamplifier to be the second combiner. Still furthermore, the connection switching function 15c controls the changeover switch of the sixth preamplifier, and sets the connection destination of the sixth preamplifier to be the second combiner.

As a result, the NMR signal from the first coil section corresponding to the first preamplifier is combined with the NMR signal from the sixth coil section corresponding to the sixth preamplifier. Similarly, the NMR signal from the second coil section corresponding to the second preamplifier is combined with the NMR signal from the fifth coil section corresponding to the fifth preamplifier. That is, the first coil section is paired with the sixth coil section, and the second coil section is paired with the fifth coil section.

In this manner, by changing the pair according to the installation orientation of the local RF coil 5, for example, even in a case in which the frequency of the two coil sections used together changes with a change in the installation orientation, the connection switching function 15c can pair the coil sections that are least frequently used together according to the installation orientation. That is, according to the installation orientation of the local RF coil 5, the connection switching function 15c can reduce the possibility of the composite process taking place, and prevent image quality degradation due to a reduction in the S/N ratio.

Figure 9:
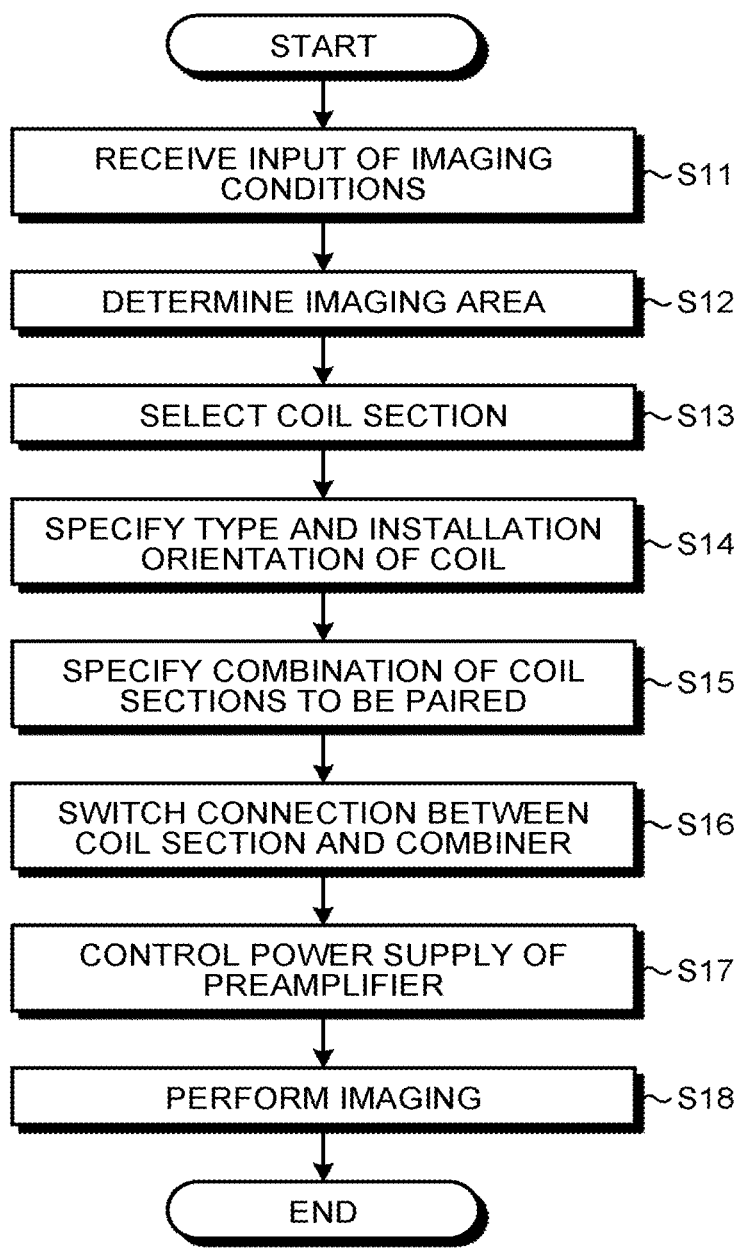
FIG. 9 is a flowchart illustrating an example of a process performed by the MRI apparatus according to the modification.

Next, a process performed by the MRI apparatus 100 according to the first modification will be described. FIG. 9 is a flowchart illustrating an example of a process performed by the MRI apparatus 100 according to the present modification. Since steps S11 to S13 are the same as steps S1 to S3 in FIG. 6, the description thereof will be omitted.

After selecting the coil sections, the connection switching function 15c of the processing circuitry 15 specifies the type and installation orientation of the local RF coil 5 (step S14). For example, the connection switching function 15c specifies the type and installation orientation of the local RF coil 5 from the imaging conditions of the subject S.

Next, the connection switching function 15c specifies the coil sections to be paired (step S15). For example, the connection switching function 15c refers to the specification table 13a in FIG. 8, and specifies the pair corresponding to the type and installation orientation of the local RF coil 5 specified at step S14, as the coil sections to be paired.

Next, the connection switching function 15c switches the connection destination of each preamplifier (step S16). For example, the connection switching function 15c controls the changeover switch of each preamplifier and switches the connection destination of each preamplifier, according to the pair specified at step S15. Since the processes subsequent to step S17 are the same as steps S4 and S5 in FIG. 6, the description thereof will be omitted.

With the MRI apparatus 100 according to the present modification, it is possible to change the pair according to the installation orientation of the local RF coil 5. As a result, the MRI apparatus 100 according to the present modification can pair the optimal coil sections according to the installation orientation, even if the optimal pair of the coil sections (for example, the pair least frequently used together) is changed according to the installation orientation. That is, with the MRI apparatus 100 according to the present modification, it is possible to reduce the possibility of the composite process taking place, and prevent image quality degradation due to a reduction in the S/N ratio, according to the installation orientation of the local RF coil 5.

Second Modification

Figure 10:
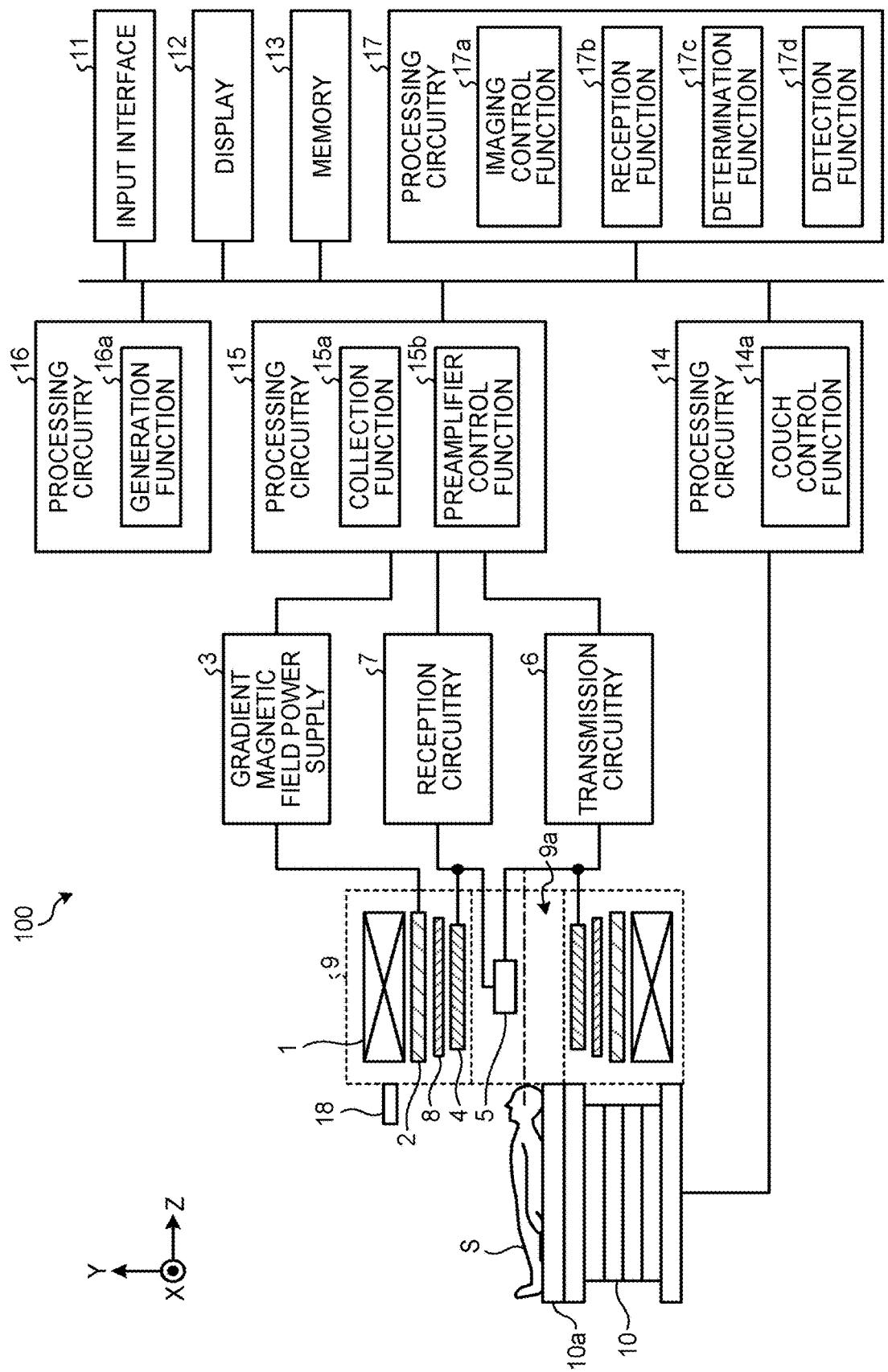
FIG. 10 is a block diagram illustrating an example of a configuration of an MRI apparatus according to a second modification.

In the first modification described above, the connection destination of each preamplifier is switched, by specifying the type and installation orientation of the local RF coil 5 on the basis of the imaging conditions of the subject S. However, the connection destination of each preamplifier may also be switched, by detecting the installation orientation of the local RF coil 5 on the basis of an optical image photographed by a ceiling camera and the like In this example, FIG. 10 is a block diagram illustrating an example of a configuration of the MRI apparatus 100 according to a second modification. The MRI apparatus 100 according to the present modification includes a camera 18. The camera 18 is an example of an imaging unit. Moreover, the processing circuitry 17 of the MRI apparatus 100 according to the present modification has a detection function 17d.

The camera 18 captures an image of the subject S placed on the couchtop 10a. The camera 18 includes a Charge Coupled Device (CCD) image sensor or a Complementary Metal Oxide Semiconductor (CMOS) image sensor, and captures an image of the subject S placed on the couchtop 10a. The camera 18 generates an optical image of the subject S, and transmits the generated optical image to the processing circuitry 17. The MRI apparatus 100 may include a plurality of the cameras 18.

The camera 18 is preferably arranged at a location where an image of the subject S placed on the couchtop 10a before being inserted into the bore 9a of the frame 9 can be captured. For example, the camera 18 is provided on the housing of the frame 9, on the ceiling or walls of the room where the MRI apparatus 100 is installed, and the like. FIG. 10 illustrates an example in which the camera 18 is provided on the housing of the frame 9 so that the camera 18 can capture an image of the subject S placed on the couchtop 10a before being inserted into the bore 9a of the frame 9.

Depending on the relation between the angle of view and the installation location of the camera 18, it may not be able to capture an optical image of the whole body of the subject S by one shot. In this case, the orientation of the subject S to be placed on the couchtop 10a may be changed according to whether the area to be image is the upper half or lower half of the body. Specifically, it is preferable to place the subject S on the couchtop 10a in head first, when the area to be imaged is the upper half of the body, and in foot first, when the area to be imaged is the lower half of the body.

Moreover, to obtain an optical image of the whole body of the subject S by one shot, the camera 18 may be configured so as to be able to capture a wide-angle image using a wide-angle imaging lens such as a wide-angle lens or a fish-eye lens. In this case, the processing circuitry 17 may correct the distortion caused by the wide-angle imaging lens, on the optical image of the subject S obtained from the camera 18.

Figure 11:
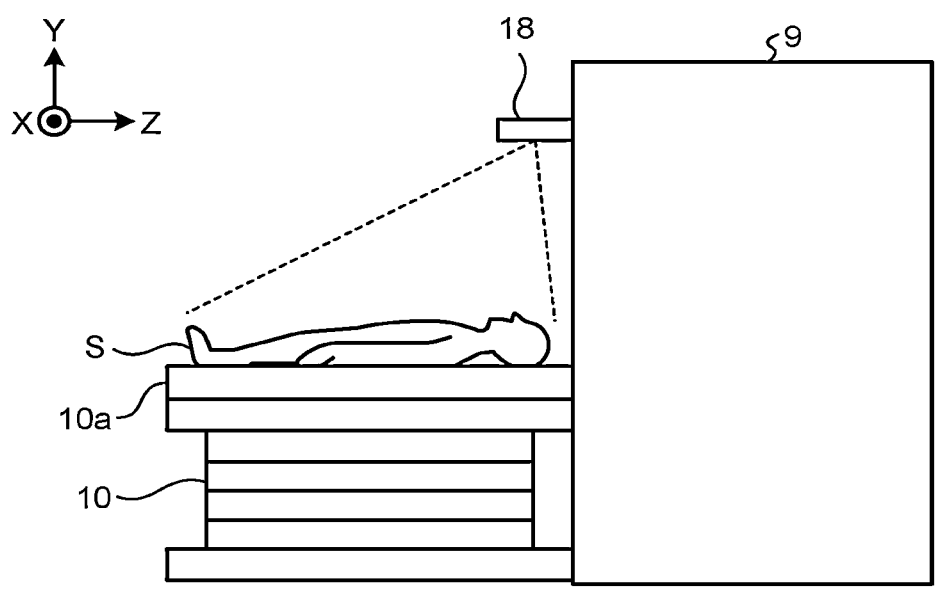
FIG. 11 is an explanatory diagram illustrating an example when an image of a subject placed on a couchtop before being inserted into a bore is captured by a single camera according to the second modification.

In this example, FIG. 11 is an explanatory diagram illustrating an example when an image of the subject S placed on the couchtop 10a before being inserted into the bore 9a is captured by a single camera 18.

As illustrated in FIG. 11, the camera 18 can capture an image of the whole body of the subject S placed on the couchtop 10a before being inserted into the bore 9a. Therefore, when the local RF coil 5 is installed in this state, the camera 18 can generate an optical image in which the subject S and the local RF coil 5 are captured.

In FIG. 11, an image of the subject S placed on the couchtop 10a before being inserted into the bore 9a is captured. However, the camera 18 may also be provided so as to be able to capture an image of the subject S placed on the couchtop 10a after being inserted into the bore 9a.

Returning to FIG. 10, the description will be continued. The detection function 17d of the processing circuitry 17 detects the installation orientation of the local RF coil 5 from the optical image photographed by the camera 18. For example, the detection function 17d analyzes the optical image in which the subject S and the local RF coil 5 are captured, and detects the type and installation orientation of the local RF coil 5.

In this case, a figure for detecting the installation orientation or the like may be provided on the surface of the local RF coil 5, and the detection function 17d may detect the installation orientation on the basis of the orientation of the figure. Since a known technique can be suitably used for analyzing an optical image, the description thereof will be omitted.

With the present modification, an optical image is used to detect the installation orientation of the local RF coil 5. Hence, compared to when the installation orientation of the local RF coil is specified from the imaging conditions, it is possible to more accurately specify the optimal pair of the coil sections.

Moreover, in the embodiments described above, the processing circuitry of the present specification is implemented by the preamplifier control function 15b of the processing circuitry 15. However, the embodiment is not limited thereto. For example, in addition to implementing the processing circuitry of the present specification with the preamplifier control function 15b described in the embodiment, the same function may be implemented by hardware only, software only, or a combination of software and hardware.

Moreover, in the above description, a "processor" reads and executes a computer program corresponding to each processing function from the memory. However, the embodiment is not limited thereto. For example, the term "processor" refers to a central processing unit (CPU), a graphics processing unit (GPU), or a circuitry such as an application specific integrated circuitry (ASIC) and a programmable logic device (for example, a simple programmable logic device (SPLD), a complex programmable logic device (CPLD), and a field programmable gate array (FPGA)).

For example, when the processor is a CPU, the processor implements each processing function by reading and executing a computer program stored in the memory. On the other hand, when the processor is an ASIC, instead of storing a computer program in the memory, the processing function is directly incorporated in the circuit of the processor as a logic circuit. Each processor of the present embodiment is not limited to being configured as a single circuit for each processor, but may also be configured as a single processor by combining a plurality of independent circuits to implement the processing function. Moreover, the components in FIG. 1 may be integrated into a single processor to implement the processing functions.

In this example, the computer program to be executed by the processor is provided by being incorporated in advance in a Read Only Memory (ROM), a memory, and the like. The computer program can be recorded and provided in a computer readable recording medium such as a Compact Disc (CD)-ROM, a Flexible Disk (FD), a CD-Recordable (R), and a Digital Versatile Disc (DVD) in a file format installable or executable in these apparatuses.

Moreover, the computer program may also be stored on a computer connected to a network such as the Internet, and provided or distributed by being downloaded via the network. For example, this computer program includes modules including each of the functional units described above. As the actual hardware, the CPU reads and executes the computer program from the recording medium such as the ROM, and each module is loaded on the main memory and generated on the main memory.

According to at least one of the embodiments described above, it is possible to increase the number of detection channels of the RF coil at a low cost.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A magnetic resonance imaging apparatus, comprising:
an RF coil that includes
a plurality of coil elements that transmit an RF pulse to a subject placed in an imaging space and that receives a signal generated from the subject by the RF pulse,
a plurality of preamplifiers each connected to each of the coil elements via an input channel with number of channels corresponding to the coil element, and that amplify the signal received by the coil element,
a plurality of combiners each connected to each pair of preamplifiers that are paired among the preamplifiers, and that generate a combined signal obtained by combining the signal amplified by the preamplifier, and
a transmission line that transmits the combined signal combined by the combiners;
reception circuitry that includes a conversion unit for converting the combined signal transmitted from the transmission line into digital data; and
processing circuitry configured to perform control of switching ON/OFF of a power supply of each of the preamplifiers, according to an imaging condition to capture an image of the subject.

2. The magnetic resonance imaging apparatus according to claim 1, wherein the processing circuitry performs control of switching ON/OFF of the power supply of each of the preamplifiers, according to an imaging area serving as an object to be imaged of the subject included in the imaging condition.

3. The magnetic resonance imaging apparatus according to claim 1, wherein when number of the conversion unit is less than number of the coil elements, the processing circuitry performs control of receiving the signal from the coil elements number of which is greater than the number of the conversion unit, by switching ON/OFF of the power supply of each of the preamplifiers and by combining the combined signal, or perform control of thinning out number of the signal to the number of the conversion unit or less.

4. The magnetic resonance imaging apparatus according to claim 1, wherein to the combiner, two or more preamplifiers among the preamplifiers that correspond to two or more coil elements among the coil elements that are proved to be less frequently used together from experience, are connected.

5. The magnetic resonance imaging apparatus according to claim 4, wherein
the RF coil further includes
a changeover switch that switches a connection state between the preamplifiers and the combiners; and
the processing circuitry performs control of switching the connection state according to an installation orientation of the RF coil.

6. The magnetic resonance imaging apparatus according to claim 5, wherein the processing circuitry
specifies the installation orientation of the RF coil based on the imaging condition, and
performs control of switching the connection state, according to the specified installation orientation of the RF coil.

7. The magnetic resonance imaging apparatus according to claim 5, further comprising:
an imaging unit capable of capturing an image of a subject placed on a couchtop, wherein
the processing circuitry
detects the installation orientation of the RF coil from an image photographed by the imaging unit, and performs control of switching the connection state according to the detected installation orientation of the RF coil.

8. An RF coil, comprising:

a plurality of coil elements configured to transmit an RF pulse to a subject placed in an imaging space and to receive a signal generated from the subject by the RF pulse;

a plurality of preamplifiers each connected to each of the coil elements via an input channel with number of channels corresponding to the coil element, and configured to amplify the signal received by the coil element;

a plurality of combiners each connected to each pair of preamplifiers that are paired among the preamplifiers, and configured to generate a combined signal obtained by combining the signal amplified by the preamplifier;

a transmission line configured to transmit the combined signal combined by the combiners; and a switch configured to switch ON/OFF of a power supply of each of the preamplifiers.

* * * * *